United States Patent [19]
Lin et al.

[11] Patent Number: 6,057,179
[45] Date of Patent: May 2, 2000

[54] METHOD AND STRUCTURE FOR PACKAGING AN INTEGRATED CIRCUIT WITH READILY REMOVED EXCESS ENCAPSULANT ON DEGATING REGION

[75] Inventors: Wen-Yen Lin; Ting-Chuan Lee, both of Taoyuan Hsien, Taiwan

[73] Assignee: Compeq Manufacturing Company Limited, Taoyuan Hsien, Taiwan

[21] Appl. No.: 09/039,812

[22] Filed: Mar. 17, 1998

[51] Int. Cl.[7] .................................................. H01L 21/44
[52] U.S. Cl. ........................... 438/127; 438/112; 438/126
[58] Field of Search .................................... 438/112, 113, 438/124, 125, 126, 127

[56] References Cited

U.S. PATENT DOCUMENTS

| | | | |
|---|---|---|---|
| 5,635,671 | 6/1997 | Freyman et al. ........................ | 257/787 |
| 5,852,870 | 12/1998 | Freyman et al. ........................ | 29/841 |
| 5,886,398 | 3/1999 | Low et al. .............................. | 257/667 |
| 5,961,912 | 10/1999 | Huang et al. ..................... | 264/272.12 |
| 5,982,625 | 11/1999 | Chen et al. ............................ | 361/748 |

*Primary Examiner*—Kevin M. Picardat
*Attorney, Agent, or Firm*—Rosenberg, Klein & Lee

[57] ABSTRACT

A method and structure for packaging an integrated circuit with an encapsulant to be readily peeled away from a degating region is disclosed. By applying an additional processing operation before a solder mask is coated over the substrate or during a process for forming the solder mask, an adhesion between the solder mask and the encapsulant is altered to become weaker than the adhesion between the solder mask and the substrate so that the excess encapsulant can be easily peeled away from the degating region without damaging the substrate.

28 Claims, 5 Drawing Sheets

METHOD AND STRUCTURE FOR PACKAGING AN INTEGRATED CIRCUIT WITH READILY REMOVED EXCESS ENCAPSULANT ON DEGATING REGION

BACKGROUND OF THE INVENTION

1. The Field of the Invention

The present invention relates to a method and structure for packaging an integrated circuit, and more particularly to a method and structure for packaging an integrated circuit with a readily removed excess encapsulant on a degating region, in which the excess encapsulant left on a mold runner can be readily removed to solve problems of insufficiency in wiring space, reducing a line density in circuitry and increasing manufacturing costs due to reserving a degating region on a substrate in advance for a purpose of peeling away the excess encapsulant from the degating region without damaging the substrate.

2. Description of the Related Art

When a ball grid array (BGA) packaging substrate is generally designed, an area corresponding to a position of a mold runner must be reserved for smoothly performing an encapsulation operation and an encapsulant material left on this area has to be easily peeled away from this area without damaging the substrate. For this, as in an application of U.S. Pat. No. 5,635,671, titled "MOLD RUNNER REMOVAL FROM A SUBSTRATE-BASED PACKAGED ELECTRONIC DEVICE", a degating region is primarily defined at a corresponding area on the substrate and the excess encapsulant left on the degating region can be easily peeled off without damaging the substrate since an adhesive force between the metal on the surface of the degating region and the encapsulant material is much smaller than the adhesive force between the metal and the substrate. The application to a BGA packaging substrate is described as follows. As shown in FIG. 5, a chip attachment area 52 is formed at a center portion of the substrate 50, a wiring area 51 formed by a very complicated wiring pattern surrounds the chip attachment area 52, an encapsulated package area 54 is covered with the encapsulant material and a cutting line 55 is prepared for cutting the substrate of a bar shape into a plurality of single unit packages. In addition, a degating region 53 formed at one corner of the substrate 50 beyond the cutting line 55 corresponding to a mold runner for receiving the encapsulant material is used for readily removed the encapsulant from the degating region 53 without damaging the substrate 50. Although the problem that the encapsulant can be easily peeled away from the degating region is solved by the above design, other shortcomings will be generated in a practical application which are as follows.

1. Because the degating region occupies a portion of a surface area of the substrate, not only is a difficulty in designing the wiring pattern increased, but also a reduction in a production yield and an increase in a noise interference are generated due to over-condensed regional circuit lines.
2. Because the degating region is reserved on the substrate, a manufacturing cost is raised since a metal area on the entire substrate surface is increased, which causes a quantity of material used in a subsequent gold-plating operation to be increased.
3. The degating region formed on the substrate continuously varies with the design of a mold tool, which results in defects of low cost-effectiveness and wasting of designing costs since the design of the substrate has to be changed regularly.

The present invention provides a better solution to overcome the problems existing in the prior art.

SUMMARY OF THE INVENTION

The present invention is directed to a method and structure for packaging an integrated circuit with a readily removed encapsulant on a degating region.

An objective of the present invention is to provide a method and structure for packaging an integrated circuit with a readily removed encapsulant on a degating region, in which an excess encapsulant left on the degating region can be easily removed to solve problems of insufficiency in wiring space, reducing a line density in circuitry and increasing in manufacturing costs due to reserving the degating region on the substrate in advance such that the excess encapsulant left on the degating region can be removed.

In accordance with one aspect of the invention, there is provided a method for packaging an integrated circuit easy to remove an excess encapsulant from a degating region including steps of forming a circuit pattern on a substrate; performing a pre-treatment operation over both sides of the substrate; forming a solder mask on both sides of the substrate and executing a pattern transfer operation; applying an electroplating operation on areas not covered by the solder mask to form a layer of metal thereon; attaching a chip to a chip attachment area on the substrate and electrically coupling a circuit connection between the chip and the circuit pattern on the substrate; guiding an encapsulant material from a mold runner on a degating region to cover a package area on the substrate; peeling off an excess encapsulant left on the mold runner; baking to polymerize the encapsulant material on the package area; attaching solder balls to the substrate; and cutting the substrate of a bar shape into a plurality of single unit packages, in which the substrate and the circuit pattern have applied thereto a surface treatment to increase an adhesion between the solder mask and the substrate before the solder mask is formed over the top side of the substrate so that the excess encapsulant can be easily peeled away from the degating region without damaging the electrical connection of the substrate.

In accordance with another aspect of the invention, there is provided a method for packaging an integrated circuit easy to remove an excess encapsulant from a degating region comprising the steps as described above, in which only a surface nature of the solder mask on the degating region is altered by applying a surface treatment thereon to form a weak adhesion between the solder mask on the degating region and the substrate during the process for forming a solder mask such that the excess encapsulant left on the mold runner can be easily peeled off without damaging the surface of the solder mask and the adhesion between the solder mask on areas other than the degating region is well maintained.

In accordance with still another aspect of the invention, there is provided a method for packaging an integrated circuit easy to remove an excess encapsulant from a degating region comprising the steps as described above, in which the substrate and the circuit pattern are applied to deteriorate an adhesion between the solder mask and the encapsulant during the process for forming a solder mask so that the excess encapsulant left on the mold runner can be easily removed from the substrate and then, the adhesion between the solder mask and the encapsulant is returned to be good during a subsequent bake and polymerization process.

In accordance with yet another aspect of the invention, there is provided a method for packaging an integrated circuit easy to remove an excess encapsulant from a degating region comprising the steps as described above, in which only the degating region on the substrate is covered by a mask and areas other than the degating region are processed by using plasma cleaner to merely achieve a strong adhesion between the solder mask and the processed areas and the encapsulant, and the adhesion between the solder mask on the degating region and the encapsulant becomes weak such that the excess encapsulant can be easily peeled off without damaging the substrate.

In accordance with yet still another aspect of the invention, there is provided a structure for packaging an integrated circuit easy to remove an excess encapsulant from a degating region including a substrate having a circuit pattern formed on a surface thereof; a solder mask laid over the surface of the substrate; a degating region defined on the substrate and processed such that the solder mask and the encapsulant on the degating region bond weakly; and an area differing from the degating region defined on the substrate and the solder mask and the encapsulant in this area bond strongly, whereby the encapsulant left on the degating region can be easily peeled off without damaging the solder mask and the substrate.

BRIEF DESCRIPTION OF THE DRAWINGS

The above objective, other features and advantages of the present invention will become more apparent by describing in detail the preferred embodiment thereof with reference to the attached drawings, in which.

DETAILED DESCRIPTION OF THE PREFERRED EMBODIMENT

Figure 1:
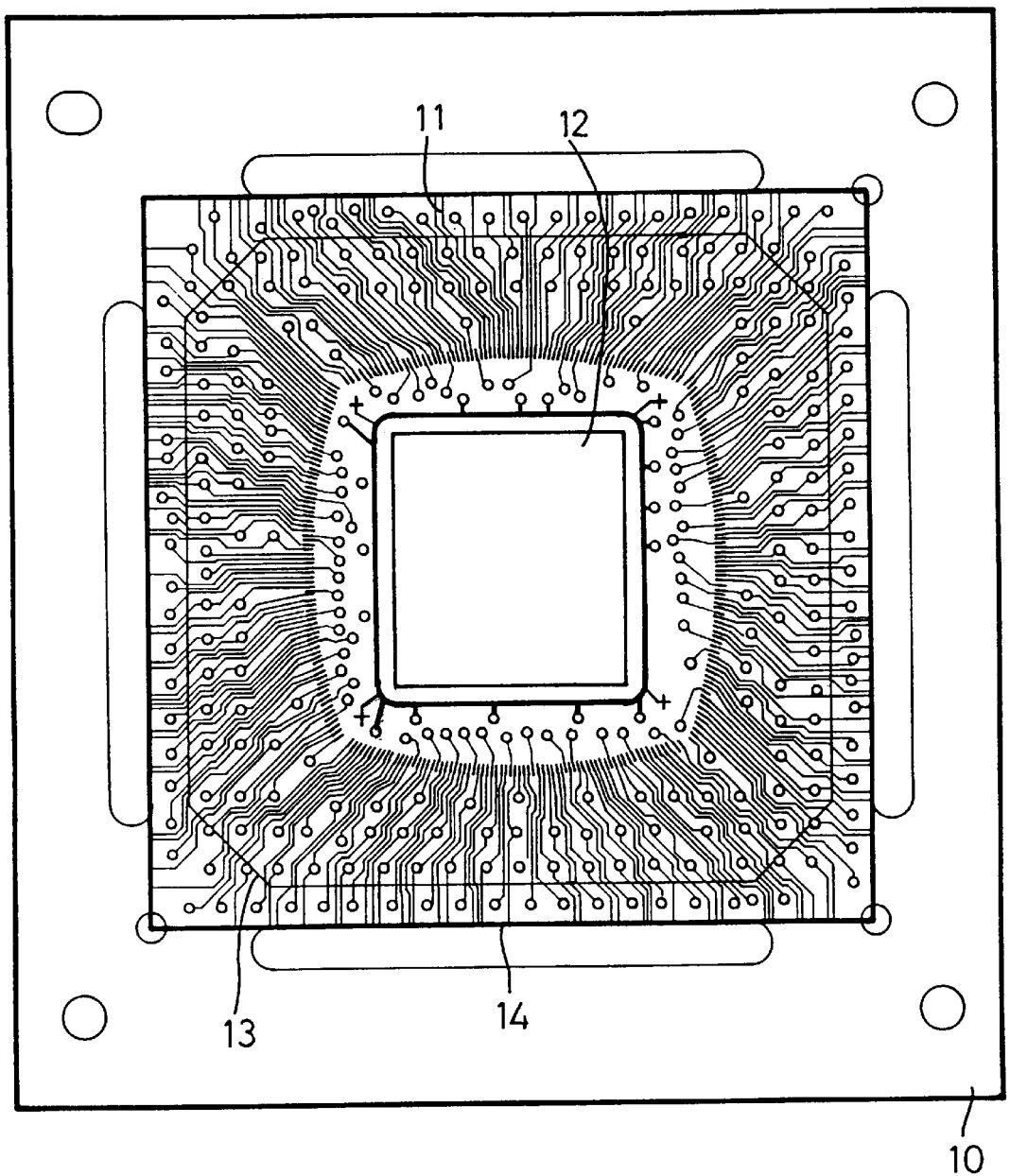
FIG. 1 shows a top view of a packaging substrate in accordance with the present invention.
Figure 5:
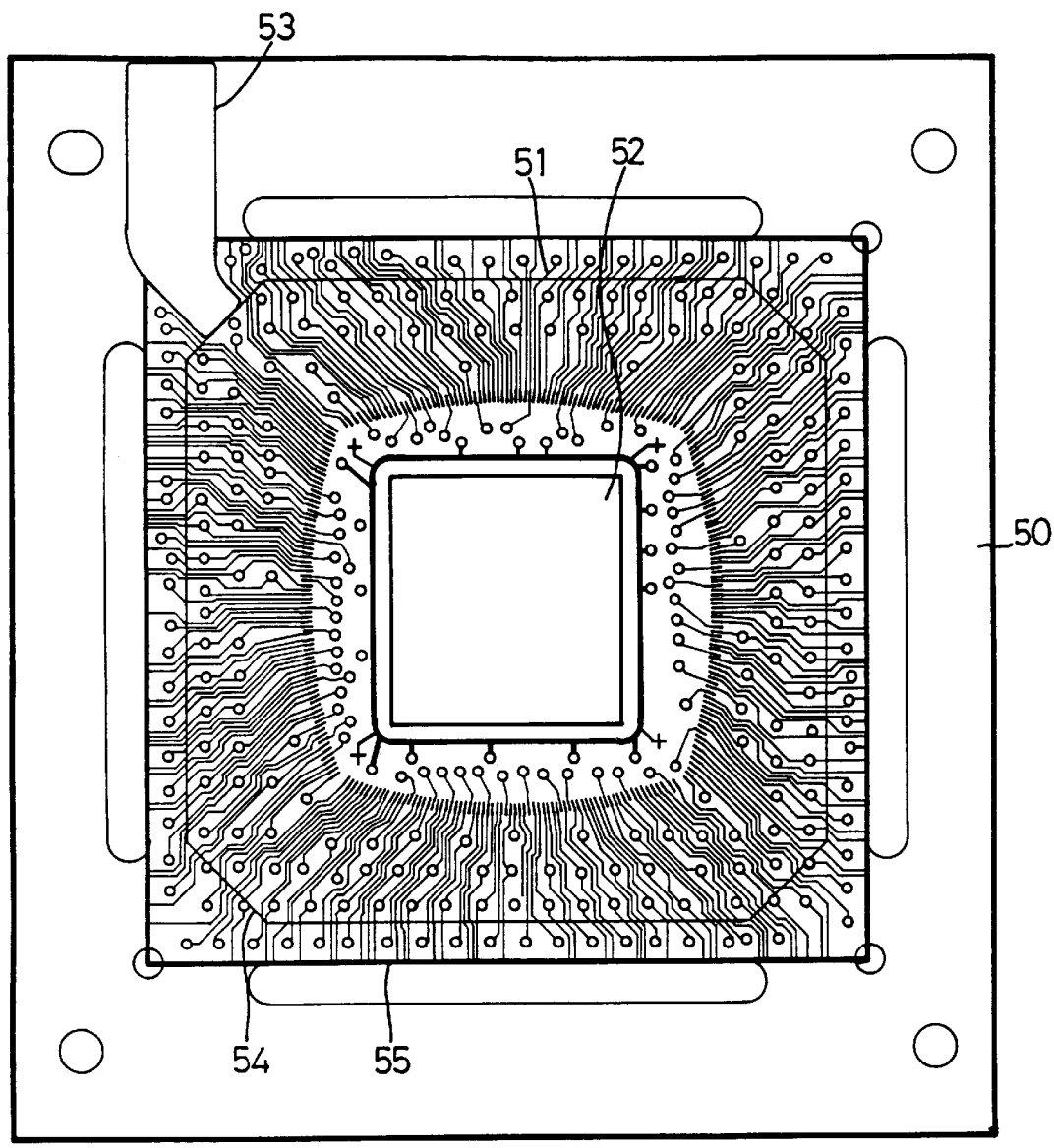
FIG. 5 shows a top view of a conventional packaging substrate with a degating region.

As clearly seen from comparing a pattern on a substrate, as shown in FIG. 1, of the present invention with that of a conventional substrate shown in FIG. 5, only a chip attachment area 12 on a center position, a wiring area 11 entirely full of a complicated circuit pattern around the chip attachment area 12, an encapsulated package area 13 and a cutting line 14 are formed on the substrate 10 of the present invention without reserving a degating region for any additional structure, that is, without requiring to have any mold runner reservation area reserved such that conventional problems of reserving the degating region for guiding an encapsulant material, increased manufacturing costs due to excessive electroplating operations and specifically designing for the degating region will not occur. In this case, the excess encapsulant left on the mold runner can be easily peeled off without damaging the substrate.

Figure 3:
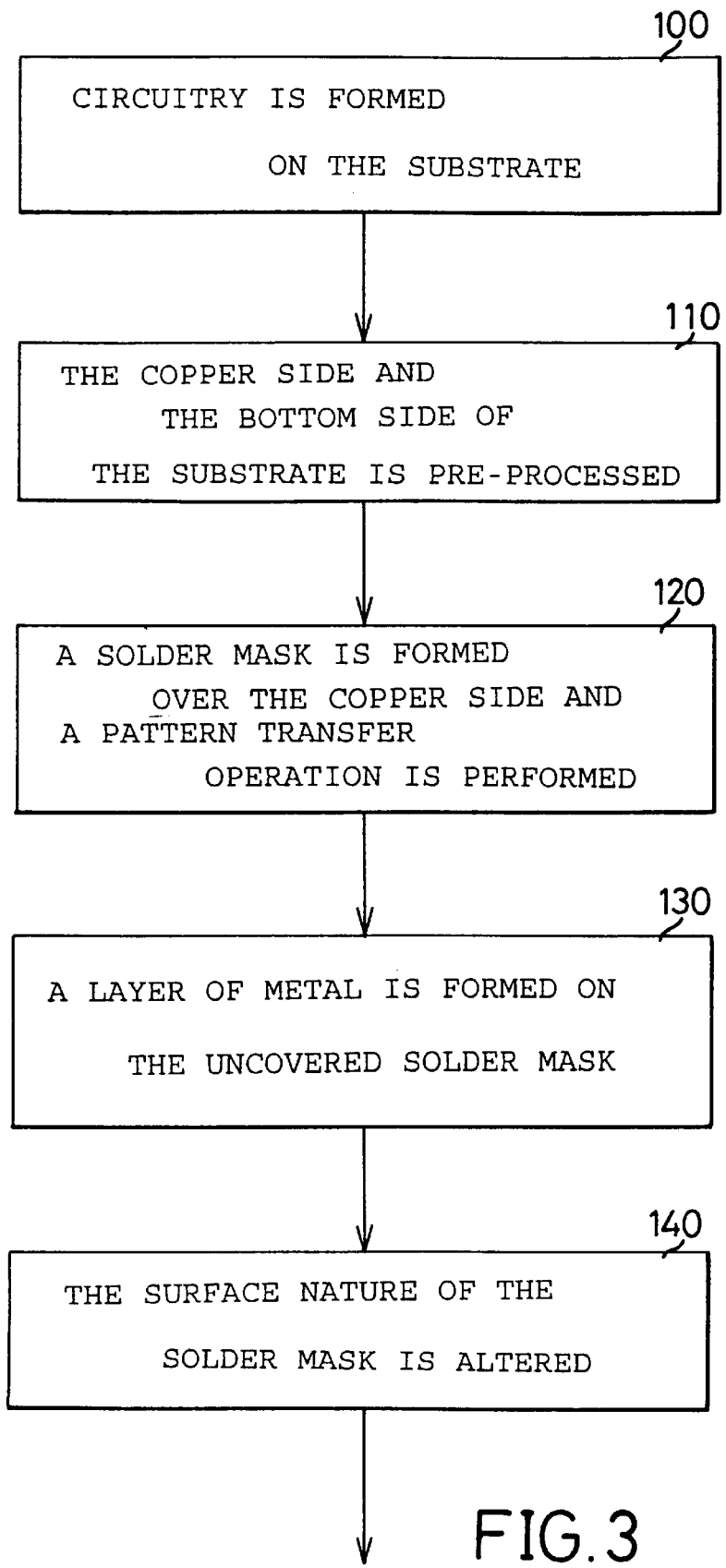
FIGS. 3 and 4 combine a flow chart showing a manufacturing process for packaging an integrated circuit in accordance with the present invention.
Figure 4:
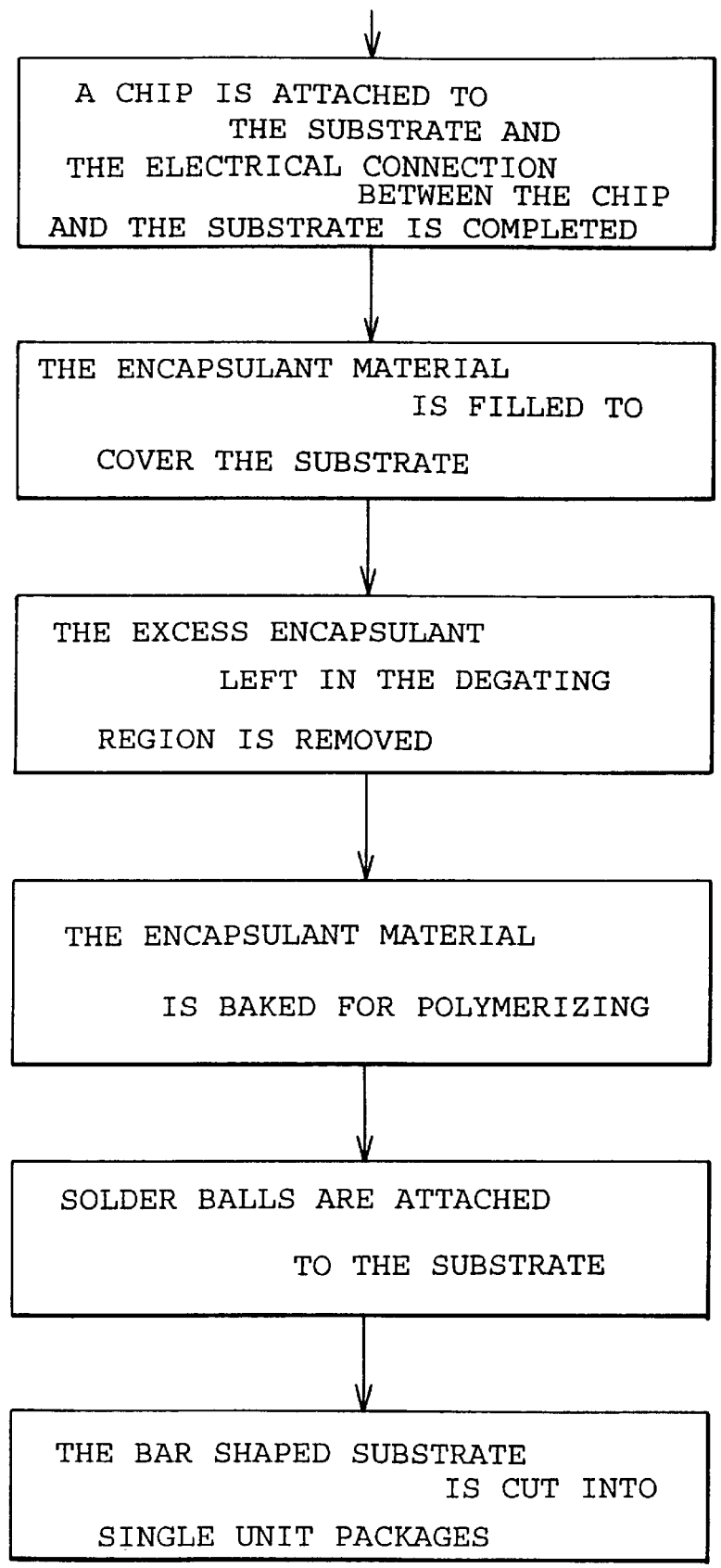

A method for packaging an integrated circuit with a readily removed excess encapsulant left on a mold runner as expected is primarily to change an adhesive force between a substrate material and an encapsulant material, which is explained by using a process for packaging a ball grid array (BGA) integrated circuit as follows. FIGS. 3 and 4 combine a flow chart illustrating a manufacturing process for packaging a BGA integrated circuit in accordance with the present invention. First, in step 100, a circuit pattern is formed on a substrate and then, in step 110, a pre-treatment operation is respectively applied on a bottom side and a top side of the substrate. In step 120, a solder mask is formed over two sides and pattern transfer operations such as exposure, development, etc. are carried out so that the solder mask covers areas requiring to be protected. In step 130, a metal-electroplating operation is performed on areas not covered by the solder mask and those areas serve as contacts for a subsequent process of attachment or connection with a chip. In step 140, an operation for changing a surface nature of the solder mask is performed by using a plasma cleaner or an ultraviolet ozone machine to remove the organic materials adhered on the surface of the substrate to thereby alter the characteristics of the surface of the solder mask and obtain a good adhesion between the encapsulant material and the solder mask to ensure a preferred performance. In steps 150 through 200, processes for attaching a chip to the chip attachment area and completing an electrical connection between the chip and the substrate by performing a wire bond operation or a single point weld operation, covering the package area 13 on the substrate by directing an encapsulant material from the mold runner, removing the excess encapsulant left on the mold runner, baking the encapsulant material on the package area to fully polymerize it, attaching solder balls to the substrate and cutting the substrate of a bar shape into a plurality of single unit packages are sequentially carried out to thereby complete the entire process for packaging the BGA integrated circuit.

An additional processing step is added before the solder mask is applied over the substrate in step 120 or during the process for forming the solder mask to achieve a change in the adhesive force between the solder mask and the substrate material or an alternation in characteristics of the solder mask covered on the mold runner, that is, to change the adhesive force between the solder mask on a specified position and the encapsulant material so that the excess encapsulant left on the mold runner can be easily peeled off. This processing method in accordance with the present invention is carried out by different embodiments which are as follows.

The processing method of a first embodiment of the present invention is to perform pre-treatment operations such as a sand blasting process, a mechanical polishing process, a chemical etching process, an ultraviolet emitting process, an infrared emitting process and a heat treatment, etc. to a substrate and a circuit pattern thereon before a solder mask is formed over the substrate. This is to increase the adhesive force between the substrate material and the solder mask so that during the step for removing the excess encapsulant left on the mold runner shown in FIGS. 3 and 4, the excess encapsulant left on the mold runner can be easily peeled away from the substrate without separating the solder mask and the substrate or the circuit pattern since the adhesion between the solder mask and the substrate is stronger than the adhesion between the encapsulant and the solder mask due to the change in solder mask characteristics and thereby achieving a result of readily peeling off the excess encapsulant on the mold runner from the substrate.

Figure 2:
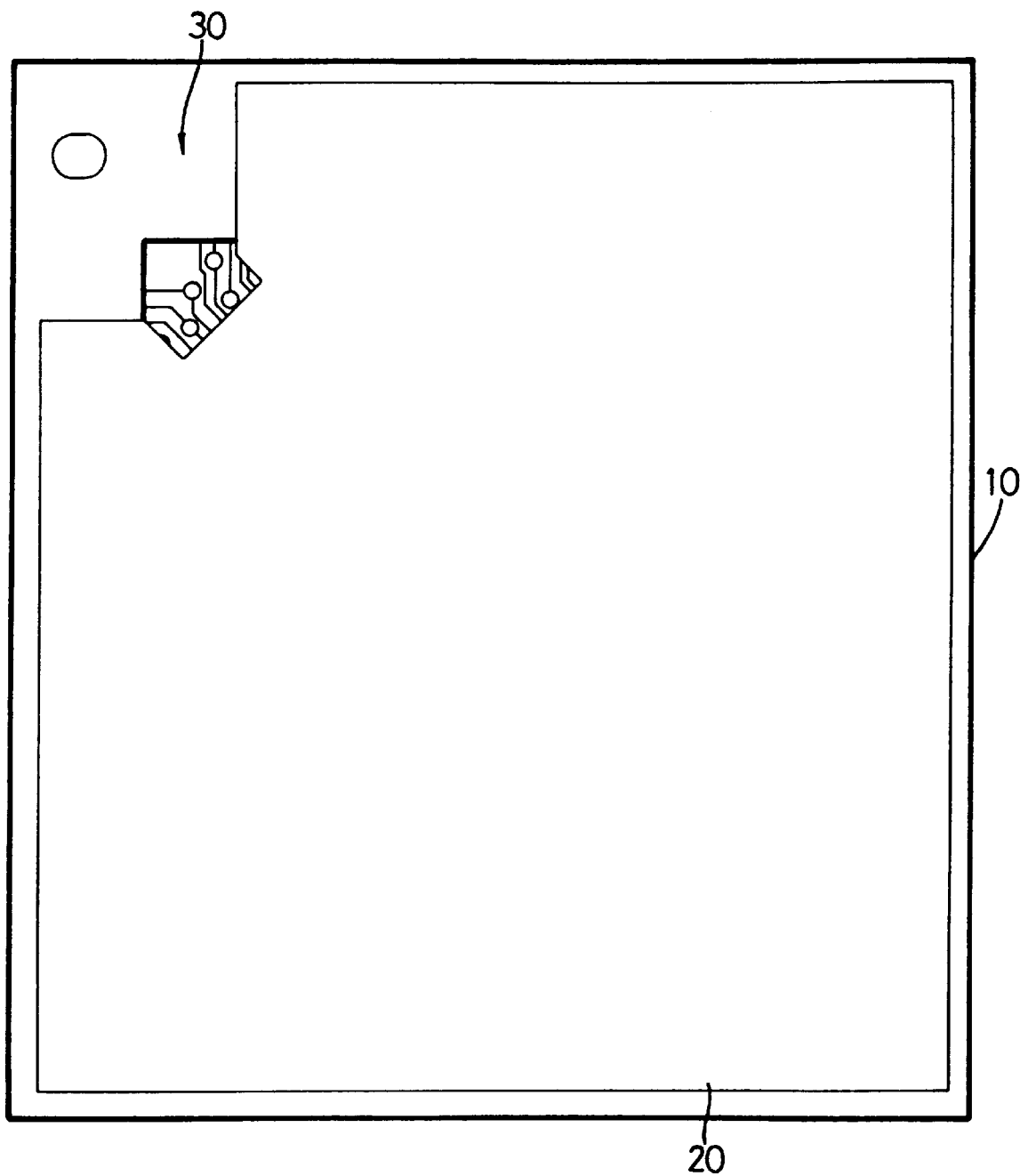
FIG. 2 shows a top view of a packaging substrate covered by a mask or a photo resist in accordance with the present invention.

The processing method of a second embodiment of the present invention is to apply a special processing operation to the mold runner during the process for forming the solder mask. As shown in FIG. 2, a bulk area beyond the degating region on the substrate 10 is covered by a mask or a layer of photo resist (PR) 20 for a protection purpose and operations such as an ultraviolet emitting process, an infrared emitting process, a mechanical polishing process, a chemical etching process, a sand blasting process, a plasma treatment, an ultraviolet ozone treatment or a heat treatment, etc. are applied on the degating region to change the characteristics of the surface of the solder mask on the degating region such that the excess encapsulant on the mold runner can be easily peeled off without damaging the solder mask or the substrate since the encapsulant is not so strongly adhered to the surface of the degating region due to a change in characteristics of the solder mask on the degating region. The adhesion between the encapsulant on other areas and the solder mask is maintained very well and an encapsulated protection performance is actually achieved since the adhesion is not affected by the above described process.

The processing method of a third embodiment of the present invention is to apply pre-treatment operations such as an ultraviolet emitting process, an infrared emitting process, a mechanical polishing process, a chemical etching process, a sand blasting process, a plasma treatment, an ultraviolet ozone treatment and a heat treatment, etc. on the surface of the solder mask during the process for forming the solder mask to alter the surface nature of the solder mask so that the excess encapsulant left on the mold runner can be easily peeled off without damaging the solder mask or the substrate due to weak adhesive force between the solder mask and the substrate material when removing the excess encapsulant from the mold runner after the package area is filled with the encapsulant material, and the adhesive condition between the solder mask and the encapsulant material on areas beyond the degating region remains good after the encapsulant material on the package area is baked to be fully polymerized.

The processing method of a fourth embodiment of the present invention is to cover the degating region on the substrate by a mask before the package area is filled with the encapsulant material and then, the substrate is processed by using a plasma cleaner or an ultraviolet ozone machine to only achieve a strong adhesive force between the solder mask on areas to be filled with the encapsulant material and the encapsulant material, and the adhesive force between the solder mask on the degating region covered by the mask and the encapsulant material is weak since the degating region does not undergo the process so that the excess encapsulant on the mold runner can be easily peeled off without damaging the solder mask or the substrate.

While the present invention has been explained in relation to its preferred embodiment, it is to be understood that various modifications thereof will be apparent to those skilled in the art upon reading this specification. Therefore, it is to be understood that the invention disclosed herein is intended to cover all such modifications as fall within the scope of the appended claims.

We claim:

1. A method for packaging an integrated circuit easy to remove an excess encapsulant from a degating region, comprising steps of:

forming a circuit pattern on a substrate;
    performing a pre-treatment operation over a bottom side and a top side of the substrate;
    forming a solder mask on two sides of the substrate and executing a pattern transfer operation;
    applying an electroplating operation on areas not covered by the solder mask to form a layer of metal thereon;
    attaching a chip to a chip attachment area on the substrate and electrically coupling a circuit connection between the chip and the circuit pattern on the substrate;
    guiding an encapsulant material from a mold runner on a degating region to cover a package area on the substrate;
    peeling off an excess encapsulant left on the mold runner;
    baking to polymerize the encapsulant material on the package area;
    attaching solder balls to the substrate; and
    cutting the substrate of a bar shape into a plurality of single unit packages,
    wherein the substrate and the circuit pattern have applied thereto a surface treatment to increase an adhesion between the substrate and the solder mask before the solder mask is formed over the top side of the substrate so that the excess encapsulant left on the mold runner can be easily peeled away without damaging the electrical connection between the chip and the circuit pattern on the substrate.

2. The method as claimed in claim 1, wherein said surface treatment is substantially an ultraviolet emitting process.

3. The method as claimed in claim 1, wherein said surface treatment is substantially an infrared emitting process.

4. The method as claimed in claim 1, wherein said surface treatment is substantially a mechanical polishing process.

5. The method as claimed in claim 1, wherein said surface treatment is substantially a chemical etching process.

6. The method as claimed in claim 1, wherein said surface treatment is substantially a sand blasting process.

7. The method as claimed in claim 1, wherein said surface treatment is substantially a heat treatment.

8. A method for packaging an integrated circuit easy to remove an excess encapsulant from a degating region, comprising the steps of:

forming a circuit pattern on a substrate;
    performing a pre-treatment operation over a bottom side and a top side of the substrate;
    forming a top mask over the top side of the substrate and executing a pattern transfer operation;
    applying an electroplating operation on areas not covered by the solder mask to form a layer of metal thereon;
    attaching a chip to a chip attachment area on the substrate and electrically coupling a line connection between the chip and the circuit pattern on the substrate;
    guiding an encapsulant material from a mold runner on a degating region to cover a package area on the substrate;
    peeling off excess encapsulant left on the mold runner;
    baking to polymerize the encapsulant material on the package area;
    attaching solder balls to the substrate; and
    cutting the substrate of a bar shape into a plurality of single unit packages,
    wherein only a surface nature of the solder mask on the degating region is altered by applying a surface treatment thereon to form a weak adhesion between the solder mask on the degating region and the substrate during the process for forming a solder mask such that the excess encapsulant left on the mold runner can be readily peeled off without damaging the surface of the solder mask and the adhesion between the encapsulant and the solder mask on areas other than the degating region is well maintained.

9. The method as claimed in claim 8, wherein a mask is laid over areas other than the degating region for protection when only the surface nature of the solder mask on the degating region is altered during the process for forming the solder mask.

10. The method as claimed in claim 9, wherein said mask is replaced by a photo resist material.

11. The method as claimed in claim 8, wherein said surface treatment is substantially an ultraviolet emitting process.

12. The method as claimed in claim 8, wherein said surface treatment is substantially an ultraviolet ozone treatment.

13. The method as claimed in claim 8, wherein said surface treatment is substantially an infrared emitting process.

14. The method as claimed in claim 8, wherein said surface treatment is substantially a mechanical polishing process.

15. The method as claimed in claim 8, wherein said surface treatment is substantially a chemical etching process.

16. The method as claimed in claim 8, wherein said surface treatment is substantially a sand blasting process.

17. The method as claimed in claim 8, wherein said surface treatment is substantially a heat treatment.

18. A method for packaging an integrated circuit easy to remove an excess encapsulant from a degating region, comprising the steps of:

forming a circuit pattern on a substrate;

performing a pre-treatment operation over a bottom side and a top side of the substrate;

forming a solder mask over two sides of the substrate and executing a pattern transfer operation;

applying an electroplating operation on areas not covered by the solder mask to form a layer of metal thereon;

attaching a chip to a chip attachment area on the substrate and electrically coupling a line connection between the chip and the circuit pattern on the substrate;

guiding an encapsulant material from a mold runner on a degating region to cover a package area on the substrate;

peeling off excess encapsulant left on the mold runner;

baking to polymerize the encapsulant material on the package area;

attaching solder balls to the substrate; and cutting the substrate of a bar shape into a plurality of single unit packages, wherein the substrate and the circuit pattern have applied thereto a surface treatment to deteriorate an adhesion between the solder mask and the encapsulant during the process for forming the solder mask so that the excess encapsulant left on the mold runner can be easily removed from the substrate and then, the adhesion between the solder mask and the encapsulant is returned to a good status during a subsequent bake and polymerization process.

19. The method as claimed in claim 18, wherein said surface treatment is substantially an ultraviolet emitting process.

20. The method as claimed in claim 18, wherein said surface treatment is substantially an ultraviolet ozone treatment.

21. The method as claimed in claim 18, wherein said surface treatment is substantially an infrared emitting process.

22. The method as claimed in claim 18, wherein said surface treatment is substantially a mechanical polishing process.

23. The method as claimed in claim 18, wherein said surface treatment is substantially a chemical etching process.

24. The method as claimed in claim 18, wherein said surface treatment is substantially a plasma treatment.

25. The method as claimed in claim 18, wherein said surface treatment is substantially a sand blasting process.

26. The method as claimed in claim 18, wherein said surface treatment is substantially a heat treatment.

27. A method for packaging an integrated circuit easy to remove an excess encapsulant from a degating region, comprising the steps of:

forming a circuit pattern on a substrate;

performing a pre-treatment operation over a bottom side and a top side of the substrate;

forming a solder mask on two sides of the substrate and executing a pattern transfer operation;

applying an electroplating operation on areas not covered by the solder mask to form a layer of metal thereon;

attaching a chip to a chip attachment area on the substrate and electrically coupling a line connection between the chip and the circuit pattern on the substrate;

guiding an encapsulant material from a mold runner on a degating region to cover a package area on the substrate;

peeling off excess encapsulant left on the mold runner;

baking to polymerize the encapsulant material on the package area;

attaching solder balls to the substrate; and cutting the substrate of a bar shape into a plurality of single unit packages, wherein only the degating region on the substrate is covered by a mask and areas other than the degating region are processed by using a plasma cleaner to merely achieve a strong adhesion between the solder mask on the processed areas and the encapsulant, and the adhesion between the solder mask on the degating region and the encapsulant becomes weak so that the excess encapsulant on the mold runner can be easily peeled off without damaging the substrate.

28. The method as claimed in claim 27, wherein said plasma cleaner can be replaced by an ultraviolet ozone machine.

* * * * *